United States Patent [19]

Namiki et al.

[11] Patent Number: 4,639,755

[45] Date of Patent: Jan. 27, 1987

[54] THERMOSENSITIVE SEMICONDUCTOR DEVICE USING DARLINGTON CIRCUIT

[75] Inventors: Masayuki Namiki; Masaaki Kamiya; Yoshikazu Kojima; Kojiro Tanaka, all of Tokyo, Japan

[73] Assignee: Kabushiki Kaisha Daini Seikosha, Tokyo, Japan

[21] Appl. No.: 413,492

[22] Filed: Aug. 31, 1982

[30] Foreign Application Priority Data

Sep. 1, 1981 [JP] Japan .................. 56-137408

[51] Int. Cl.$^4$ .......................................... H01L 23/56
[52] U.S. Cl. ...................... 357/28; 357/36; 357/46; 357/34; 307/315; 307/317 R; 307/299 B
[58] Field of Search .................. 357/36, 28, 46, 44, 357/35, 34; 307/315, 317 R, 299 B

[56] References Cited

U.S. PATENT DOCUMENTS

| 3,867,650 | 2/1975 | Baldwin | 307/315 X |
|---|---|---|---|
| 4,065,187 | 12/1977 | Suzuki et al. | 357/46 X |
| 4,078,208 | 3/1978 | Hart et al. | 357/46 X |
| 4,136,355 | 1/1979 | Mizukoshi et al. | 357/46 |
| 4,142,115 | 2/1979 | Nakata et al. | 357/28 X |
| 4,287,440 | 9/1981 | Kamiya et al. | 307/315 |
| 4,328,509 | 5/1982 | Lehning | 357/92 X |
| 4,329,598 | 5/1982 | Welland | 307/310 X |
| 4,346,313 | 8/1982 | Blossfeld | 307/299 B X |
| 4,471,236 | 9/1984 | Patterson, III | 307/310 |

FOREIGN PATENT DOCUMENTS

| 2335055 | 7/1977 | France | 357/46 |
|---|---|---|---|
| 0019684 | 2/1979 | Japan | 357/28 |
| 0135963 | 10/1981 | Japan | 357/28 |
| 57-145355 | 9/1982 | Japan | 357/46 |
| 0048963 | 3/1983 | Japan | 357/28 |
| 2105109 | 3/1983 | United Kingdom | 357/28 |

OTHER PUBLICATIONS

Tsui, "Making High-$\beta$ and Low-$\beta$ Transistors on the Same Chip," *IBM Technical Disclosure Bulletin*, vol. 15, No. 1, Jun. 72, p. 232.

Primary Examiner—Martin H. Edlow
Assistant Examiner—William A. Mintel
Attorney, Agent, or Firm—Robert E. Burns; Emmanuel J. Lobato; Bruce L. Adams

[57] ABSTRACT

A thermosensitive semiconductor device has a semiconductor substrate of one conductivity type which is used as the common collector of at least two Darlington-connected transistors. The base of the first stage transistor is connected to the common collector to form a first terminal and the emitter of the final stage transistor forms a second terminal. A constant current source is connected between the first and second terminals. To reduce deviations in the temperature response, a second collector region can be used and which can extend to a depth deeper than the depth of the emitter of the final stage transistor to absorb some of the carriers injected by the emitter.

6 Claims, 10 Drawing Figures

THERMOSENSITIVE SEMICONDUCTOR DEVICE USING DARLINGTON CIRCUIT

BACKGROUND OF THE INVENTION

The present invention relates to a thermosensitive semiconductor device which has a high thermo-sensitivity and can be manufactured with high yield.

A transducer for converting a temperature value into an electric signal, that is, a temperature sensor is used in various fields today, and the demand for such a sensor continues to increase. For example, in our daily lives, such a sensor is used in an air-conditioner (heating fan, cooler), refrigerator, electric heater, electric blanket, electric range, electric oven, and the like.

For contact type thermo-sensors, a bi-metal, a thermistor, a p-n junction semiconductor, a resistor for temperature measuring, a thermocouple, a liquid thermosensor, a p-n junction transistor or the like have been used.

The P-N junction semiconductor is the most suitable of all devices for use as a temperature sensor which can be effectively manufactured by a mass-production system and by the use of integrated circuit techniques. One example of the structure of such a thermosensitive IC is illustrated in FIG. 1. In this case, an IC using an n-type Si substrate will be described.

A constant current circuit 2 for providing a constant current (e.g. about 0.1 μA) is connected to a junction transistor 1 to cause a constant current to flow through the transistor 1, to thereby form a thermosensor and the voltage between the base-emitter of the junction transistor is produced as a temperature detected voltage $V_{out}$. In FIG. 1, 3 is a power source circuit including a voltage regulating circuit for providing a constant voltage regardless of changes in the source voltage. In order to reduce the power consumption in the constant current source 2 and the voltage regulating circuit, these circuits are formed in the form of an integrated circuit by the use of the complementary type insulation gate field effect transistor (referred to as C-MOS hereinafter), and an n-p-n planar type junction transistor, which has a structure as shown in FIG. 2, can be formed in the same manufacturing process as that for the C-MOS and used as the junction transistor 1.

FIG. 2a is a sectional view illustrating a structure of the most basic NPN planar Si junction transistor and FIG. 2b is a plan view thereof as viewed along section line A—A. That is, in this transistor, an N⁻Si substrate 4 acts as the collector, a P⁻Si region 5 acts as the base and an N⁺ diffusion layer 8 acts as the emitter. The equivalent circuit of the transistor is illustrated in FIG. 2c. As shown in FIG. 2a, 7 is a P⁺ channel-cut region, 6 is an N⁺ diffusion region, 9 is an oxide insulation film, 10 is a metal electrode, 11 is a base-collector terminal and 12 is an emitter terminal.

When the collector 4 and the base 5 of the junction transistor are at the same potential, the characteristic of the emitter current I will be the same as the current-voltage characteristic of a diode and it can be expressed by the following equation.

$$I = A \cdot n_i^2 \cdot \exp\left(\frac{eV}{nRT}\right) \quad (1)$$

where, $n_i$: intrinsic carrier density
n: emitter injection efficiency
R: Boltzmann's constant,
e: unit charge,
V: voltage between base and emitter
A: constant which depends upon the configuration of the junction transistor and the diffusion length of the minority carriers.

The current-voltage characteristics between the base 5 and the emitter 8 correspond to the characteristics shown in FIG. 3, and each characteristic curve depends upon the changes in temperature. $T_1$, $T_2$ and $T_3$ represent different temperature values and have the relationship of $T_1 > T_2 > T_3$. As described above, by the use of the CMOS process, a thermosensing element can be easily fabricated on a chip at the same time the constant current circuit and voltage regulating circuit are fabricated, and it is widely used as a one-chip thermosensor for various controls. In this device, the temperature coefficient of 3 mV/°C. can be obtained for a P⁻N⁺ junction area of 100×100 μm², P⁻ well concentration (base diffusion concentration) of 5×10¹⁵ atoms.cm⁻³ and a constant current of 0.1 μA in the forward direction. There is the disadvantage that the thermosensitivity of the thermosensor using such a junction transistor is lower than the thermosensitivity (15 mV/°C.) of the thermosensor using a thermistor.

SUMMARY OF THE INVENTION

It is an object of the present invention to provide a high sensitivity thermosensor which can be obtained by connecting NPN transistors a multi-stage configuration.

BRIEF DESCRIPTION OF THE DRAWINGS

FIG. 2b is a plan view taken along line A—A of FIG. 2a.

FIG. 2c is a circuit diagram of the transistor structure of FIG. 2a.

DETAILED DESCRIPTION OF PREFERRED EMBODIMENTS

Figure 4A:
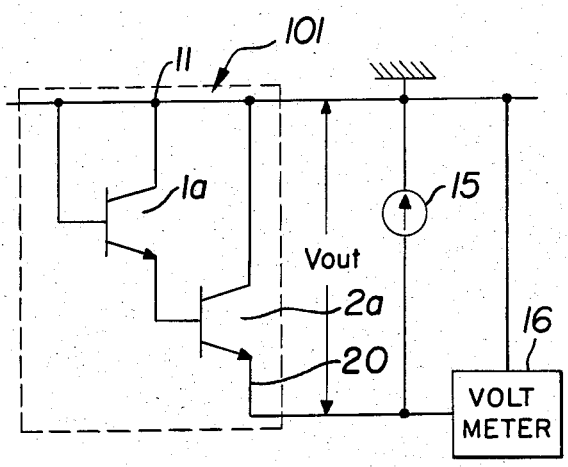
FIG. 4a is a circuit diagram of a two-stage connection of junction trnsistors in the form of a Darlington connection according to a first embodiment of present invention.
Figure 4B:
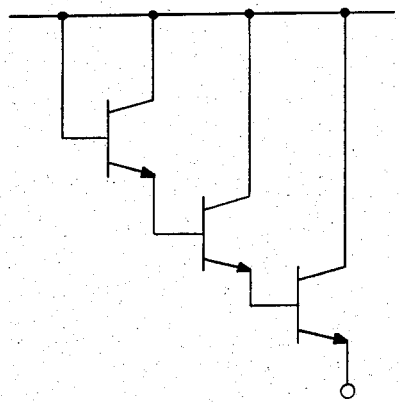
FIG. 4b is a circuit diagram of a three-stage Darlington connection according to the present invention.

Recently, we succeeded in attaining two times the thermosensitivity as compared with the conventional thermosensors, e.g., a thermosensitivity of 6 mV/°C., by the use of a thermosensor in which the transistors having an equivalent circuit as shown in FIG. 4a are connected in the form of Darlington connection. Furthermore, we succeeded in attaining a thermosensitivity of 11 mV/°C. by the use of a thermosensor in which the transistors are connected to from a three-stage Darlington structure as shown in FIG. 4b.

Figure 1:
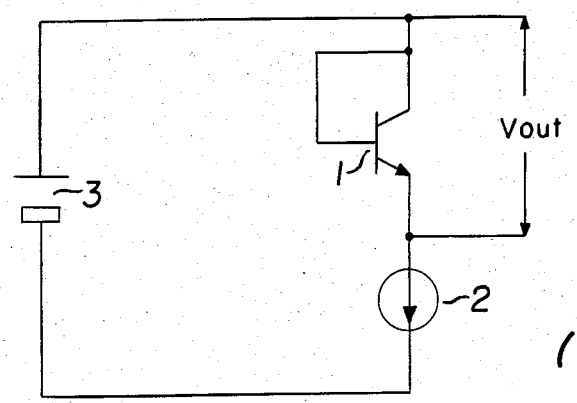
FIG. 1 is a circuit diagram of the conventional thermosensor using a junction transistor.

FIG. 4a shows a thermosensitive semiconductor device 101 according to one embodiment of the present invention (within the broken line) and an embodiment of the temperature detecting circuit for use therewith. The base and the collector of a transistor 1a are connected together at a connecting point 11 and the transistor 1a is the same as the transistor shown in FIG. 1. The emitter of the transistor 1a is connected to a base of the transistor 2a and the collectors are commonly connected at the connecting point 11 to form what is called a Darlington connection. When a constant current from a constant current source 15 flows through the emitter of the transistor 2a and the common collectors of the transistors 1a and 2a, the sum of the voltages which are developed between the base and the emitter of the transistor 1a and between the base and the emitter of the transistor 2a, respectively, appeals across the thermosensitive semiconductor device 101. Therefore, the thermosensitivity of the thermosensitive semiconductor device 101 ranges approximately between 5 mV/°C. and 6 mV/°C. which is equal to about two times that of the thermosensitivity of the thermosensitive element 1 shown in FIG. 1. When the number of the transistors which are connected in a Darlington connection is increased, the thermosensitivity increases in proportion to the number of the transistors. A voltmeter 16 is formed by the use of CMOS IC, and functions as a thermometer of the chip which has a temperature accuracy of 1° C.

The second embodiment of the present invention provides a thermosensitive semiconductor device having high thermosensitivity, low deviation of the thermosensitivity, good noise stability, and good suitability for fabricating in the form of an integrated circuit.

Figure 2A:
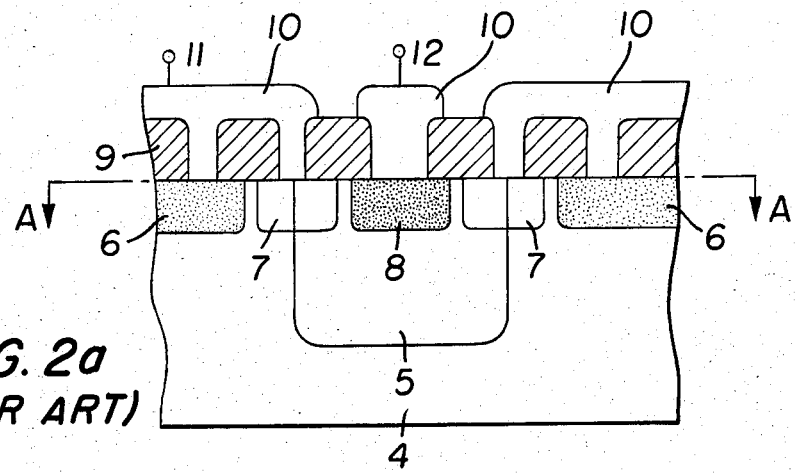
FIG. 2a is a sectional view of a conventional thermosensitive semiconductor device using a junction transistor.
Figure 2B:
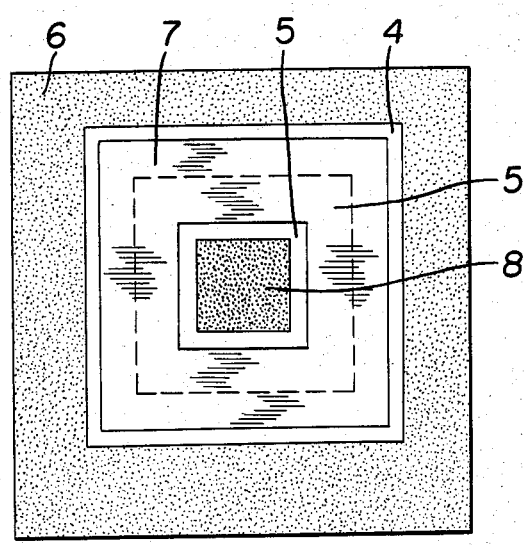
Figure 2C:
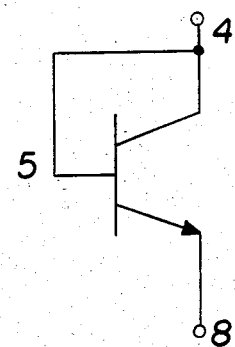
Figure 3:
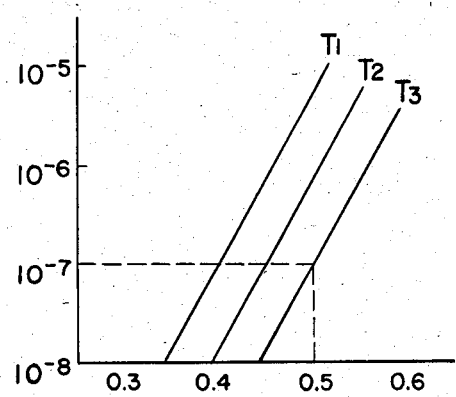
FIG. 3 is a family of conventional current-voltage characteristic curves when the collector and the base of a junction transistor are at the same potential.
Figure 5:
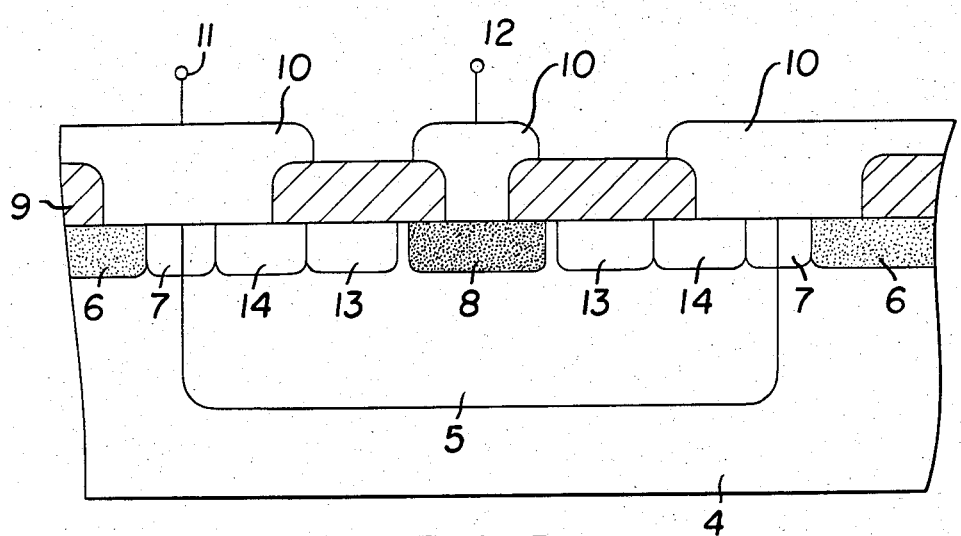
FIG. 5 is a sectional view showing the structure of a junction type planar transistor according to a second embodiment of present invention.

The second embodiment of the present invention, provides a thermosensitive P-N junction transistor wherein the value of the current amplification factor $\beta$ is reduced, and such will be described in more detail in conjunction with the sectional view of FIG. 5 and the circuit diagram of FIG. 7. In addition to the basic structure of the thermosensitive semiconductor element shown in FIG. 2a in which the N−Si substrate 4 acts as the collector, the P−Si region 5 acts as the base and the N+ diffusion layer 8 acts as the emitter, there is provided an N+ diffusion layer 14 through a P+ channel-cut region 13 adjacent to the N+ diffusion region 8 acting as the emitter. The N+ diffusion layer 14 is connected to the N+ diffusion layer 6 acting as a collector 6 through a metal electrode 10. That is, the N+ diffusion layer 14 functions as a second collector, and some of the carriers injected from the emitter are absorbed into the N+ diffusion layer 14 which is provided so as to act as the second collector. FIG. 5 shows one portion of the circuit of FIG. 7 which shows the path for the return current $I_c$ from the collector to the base so as to reduce the value of $\beta$. By employing the double collector structure (first or primary collector 4 and second or secondary collector 14), it is possible to reduce deviation in the detected temperature-sensitive voltage by about 20%.

Figure 6:
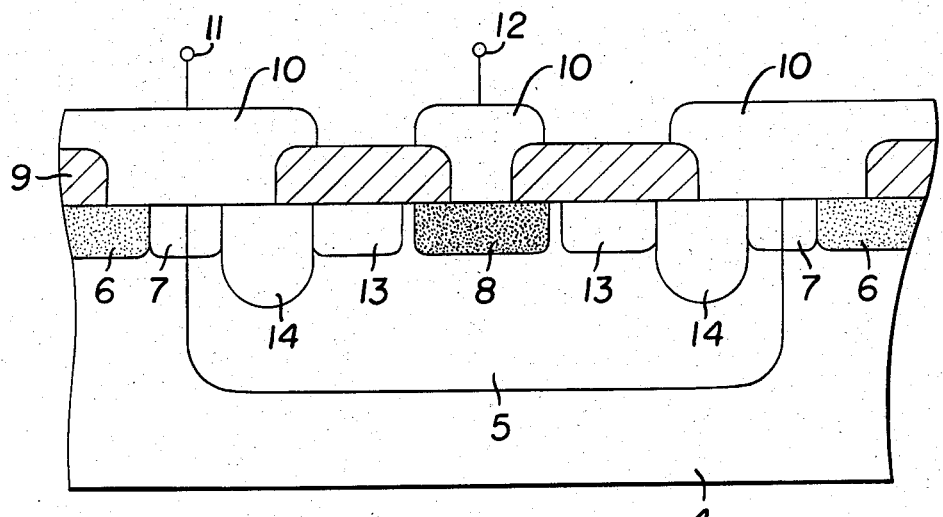
FIG. 6 is a sectional view showing the structure of a third embodiment of the present invention.
Figure 7:
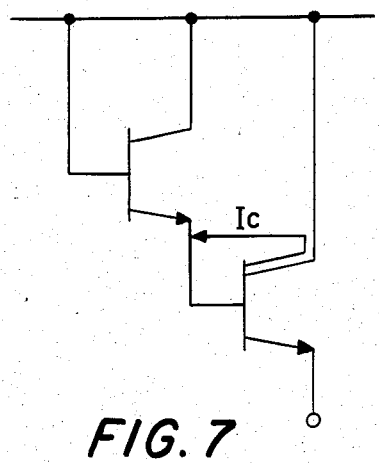
FIG. 7 is a circuit diagram showing the multi-collector transistors according to the second and third embodiments of the present invention connected in the form of a Darlington connection.

According to a third embodiment of the present invention shown in FIG. 6 which, like FIG. 5, shows one portion of the circuit of FIG. 7, the deviation is further reduced due to the double collector structure. The device shown in FIG. 6 has an N+ diffusion region collector 14 which is more deeply diffused than that of the emitter N+ diffusion region 8, In FIG. 5 and FIG. 6, 4 is an N− substrate, 6 is an N+ diffusion collector, 13 is a P+ channel-cut region, 8 is an N+ diffusion emitter, 14, which is a main feature of the present invention, is an N+ diffusion collector, 9 is an oxide film, 10 is a metal electrode, 11 is a collector. base terminal and 12 is an emitter terminal. According to the present invention, the aforementioned double collector region 14 is used for the connection of a multi-stage Darlington such as two stage, three stage and the like.

As described above, the thermosensitive semiconductor device can be fabricated by the use of C-MOS fabriacting techniques. Furthermore, when the two stage, three stage or multi stage Darlington connection is used, a high sensitivity is obtained due to the reduction in the current amplification factor $\beta$ in view of the N-P-N planar junction transistor structure which can be easily fabricated in the form of integrated circuit. Also, the drift due to noise can be decreased and the yield can be improved. The thermosensitivity thereof is 3 mV/°C. for a one-stage type, 6 mV/°C. for the two-stage type and 11 mV/°C. for the three-stage type. As mentioned above, according to the present invention, it is possible to provide a high sensitivity thermosensitive semiconductor device which can be fabricated with high yield and operates in a stable condition.

A Si NPN junction planar transistor is used in the above-described embodiment of the present invention, however, the same effect as that obtained by the above-mentioned embodiments can be attained by the use of PNP junction transistors. In addition, the thermosensitive semiconductor device of present invention can be realized by the use of semiconductor material other than Si.

We claim:

1. A thermosensitive semiconductor device comprising: transistors connected in a Darlington connection and formed on a semiconductor substrate of one conductivity type which constitutes a common collector acting as a first collector region of each of the transistors, the semiconductor substrate having formed thereon a base region and an emitter region of each of the transistors, the base region of the first stage transistor in the Darlington connection being connected to said common collector to constitute a first terminal of the device, the emitter region of the final stage transistor of the Darlington connection constituting a second terminal of the device, and a constant current source connected between the first and second terminals.

2. A device as claimed in claim 1; wherein at least one of said transistors has a secondary collector region in said semiconductor substrate which is spaced apart from and not electrically connected to said first collector region, the secondary collector region being connected to the base region of the transistor having the secondary collector region.

3. A device is claimed in claim 2; wherein the secondary collector region is deeper than the depth of a channel-cut region in said semiconductor substrate which is formed around the emitter region of the transistor having the secondary collector region and is also deeper than said emitter region.

4. A thermosensitive semiconductor device comprising: a semiconductor substrate of one conductivity type; at least two transistors connected in a Darlington configuration and formed on the semiconductor substrate which comprises a common collector acting as a first collector region of each transistor, each transistor having a base region and an emitter region formed on the semiconductor substrate; means connecting the base region of the first stage transistor of the Darlington configuration to the common collector to define a first terminal of the device; means connected to the emitter of the final stage transistor of the Darlington configuration to define a second terminal of the device; a constant current source connected between the first and second terminals; and means for taking out a temperature-sensitive voltage across the common collector and the emitter region of the final stage transistor.

5. A thermosensitive semiconductor device according to claim 4; wherein at least one of the transistors has a secondary collector region formed in the semiconductor substrate, the secondary collector region being electrically isolated from the first collector region of said one transistor and being connected to the base region of said one transistor.

6. A thermosensitive semiconductor device according to claim 5; wherein said one transistor has a channel-cut region formed in the semiconductor substrate around the emitter region of said one transistor, the secondary collector region being the deeper than the depth of the channel-cut region and deeper than the depth of the emitter region of said one transistor.

* * * * *